(12) United States Patent
Takagi et al.

(10) Patent No.: US 8,797,747 B2
(45) Date of Patent: Aug. 5, 2014

(54) ELECTRONIC CONTROL UNIT

(75) Inventors: Akira Takagi, Obu (JP); Yuzuru Sudani, Hekinan (JP)

(73) Assignee: Denso Corporation, Kariya (JP)

( * ) Notice: Subject to any disclaimer, the term of this patent is extended or adjusted under 35 U.S.C. 154(b) by 134 days.

(21) Appl. No.: 13/603,604

(22) Filed: Sep. 5, 2012

(65) Prior Publication Data
US 2013/0107474 A1 May 2, 2013

(30) Foreign Application Priority Data
Oct. 28, 2011 (JP) .................. 2011-237083

(51) Int. Cl.
*H05K 1/00* (2006.01)
*H05K 1/18* (2006.01)
*H05K 7/00* (2006.01)

(52) U.S. Cl.
USPC ............ 361/748; 361/679.02; 361/752

(58) Field of Classification Search
USPC .................. 361/748, 679.02, 752
See application file for complete search history.

(56) References Cited

U.S. PATENT DOCUMENTS

| 5,475,626 A * | 12/1995 | Viletto ............ 361/679.55 |
| 2004/0184244 A1* | 9/2004 | Uezono ................ 361/748 |
| 2007/0051596 A1 | 3/2007 | Kanno et al. |

* cited by examiner

*Primary Examiner* — Andargie M Aychillhum

(57) ABSTRACT

A control circuit is molded with a package portion and connected with first terminals. A wiring portion includes second terminals connected with the first terminals and partially molded with a molded portion. The molded portion includes a first fitting portion surrounding the control circuit. A cover portion includes a second fitting portion fitted to the first fitting portion to cover the control circuit. The first and second fitting portions form a gap therebetween. The gap extends in a crank form along a first direction and extends in a crank form along a second direction, which is perpendicular to the first direction.

6 Claims, 6 Drawing Sheets

ELECTRONIC CONTROL UNIT

CROSS REFERENCE TO RELATED APPLICATION

This application is based on reference Japanese Patent Application No. 2011-237083 filed on Oct. 28, 2011, the disclosure of which is incorporated herein by reference.

TECHNICAL FIELD

The present disclosure relates to an electronic control unit, such as an electronic component for controlling an automatic transmission device.

BACKGROUND

A known automatic transmission device is configured to engage multiple friction elements, such as a clutch device and a brake device, selectively with each other or disengage the multiple friction elements selectively from each other to shift gears of the automatic transmission device. Such friction elements are manipulated with working fluid supplied from an output port of a linear solenoid valve. Such a linear solenoid valve may be controlled according to an instruction signal received from an electronic control unit. Such an electronic control unit may employ various configurations. For example, the patent document 1 discloses an electronic control unit housed in an automatic transmission device. In the configuration of the patent document 1, a control circuit portion and a wiring portion are electrically connected with each other via terminals. In addition, the control circuit portion and the wiring portion are sealed with an upper resin member and a lower resin member.

Patent Document 1

Publication of unexamined patent publication US 2007/0051596 A1

In the electronic control unit of the patent documents 1, the upper resin member and the lower resin member define an inner space, which is sealed therebetween. In the configuration of the patent documents 1, when pressure in the inner space is raised due to increase in temperature, the resin member may be deformed, or joint portions of the terminals may be broken. In addition, a needlelike long and thin foreign particle may intrude into the inner space through a small gap between the upper resin member and the lower resin member. In a case where the foreign particle is electrically conductive, the foreign particle may cause short circuit between adjacent terminals in the inner space.

SUMMARY

It is an object of the present disclosure to produce an electronic control unit configured to restrict increase in internal pressure and intrusion of a foreign particle.

According to an aspect of the present disclosure, an electronic control unit comprises a control circuit portion including a control circuit, a package portion molded with the control circuit, and a plurality of first terminals electrically connected with the control circuit and exposed to an outside of the package portion. The electronic control unit further comprises a wiring unit including a plurality of second terminals electrically connected with the plurality of first terminals, and a molded portion molded with a part of the plurality of second terminals. The molded portion includes a first fitting portion located on a side of the control circuit portion. The first fitting portion is in a frame shape and surrounds the control circuit portion. The electronic control unit further comprises a cover portion including a second fitting portion fitted to the first fitting portion of the wiring unit to cover the control circuit portion. The first fitting portion and the second fitting portion form a gap therebetween. The gap extends in a crank form along a first direction and extends in a crank form along a second direction, which is perpendicular to the first direction.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

Embodiment

Figure 1:
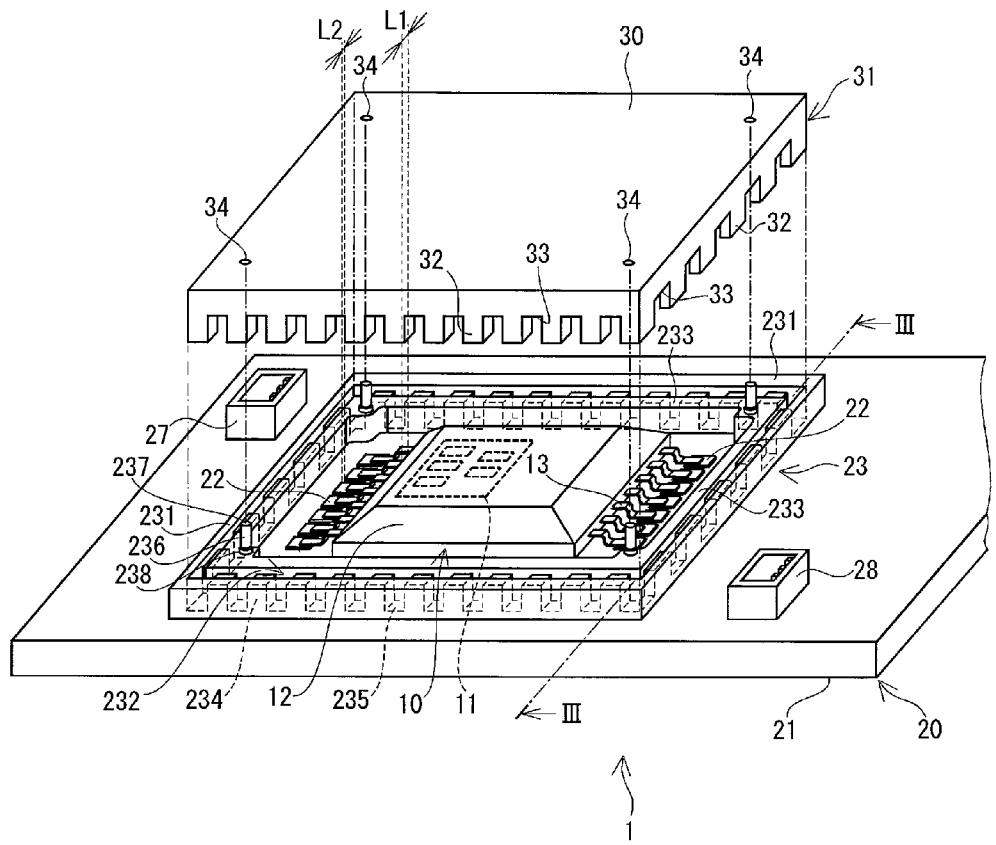
FIG. 1 is an exploded perspective view showing an electronic control unit according to one embodiment.
Figure 1:
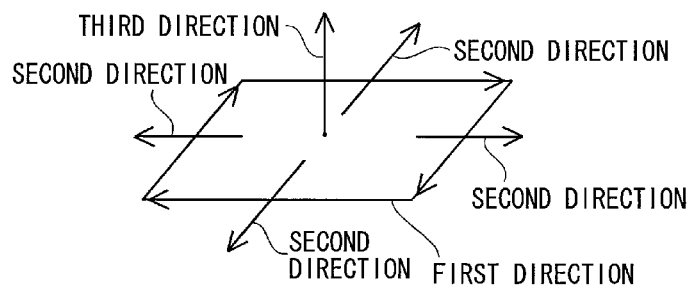
Figure 2:
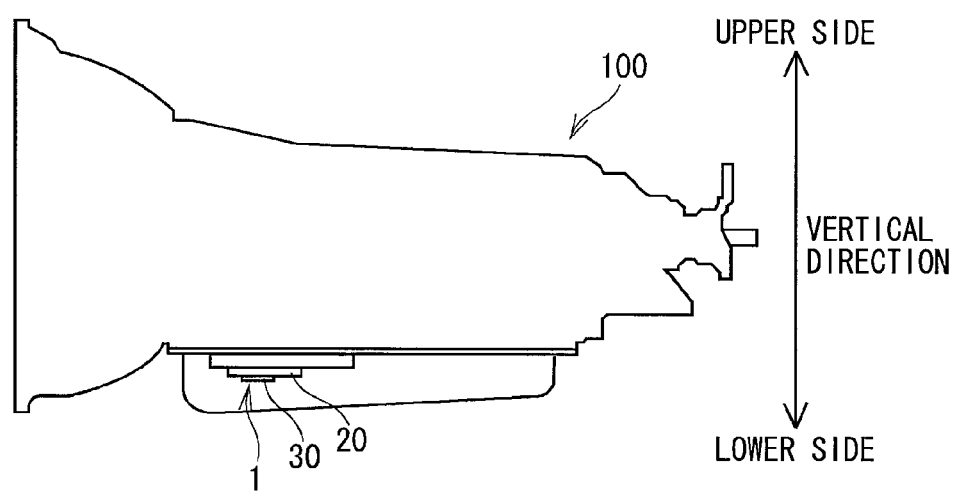
FIG. 2 is a schematic view showing an automatic transmission device according to the one embodiment.

As follows, an embodiment of the present disclosure will be described with reference to drawings. As shown in FIG. 2, an electronic control unit 1 of the present embodiment is configured to send an instruction to a linear solenoid valve equipped to an automatic transmission device 100 of a vehicle. The linear solenoid valve is configured to engage multiple friction elements selectively with each other or disengage the multiple friction elements selectively from each other to shift gears of the automatic transmission device 100. As shown in FIG. 1, the electronic control unit 1 includes a control circuit portion 10, a wiring portion 20, a cover portion 30, and the like. The cover portion 30 is substantially in a rectangular shape. Referring to FIG. 2, the electronic control unit 1 is equipped to the automatic transmission device 100 such that the cover portion 30 is located on the lower side relative to the wiring portion 20 in the vertical direction.

The control circuit portion 10 is a transmission control unit (TCU) including a control circuit 11, a package portion 12, and multiple first terminals 13. The package portion 12 is in a rectangle thin board shape. Each of the first terminals 13 extends from the package portion 12 in the lateral direction.

The control circuit 11 functions, for example, as a computer including a CPU, a ROM, a RAM, an I/O device, and a bus line, which connects these components. The package portion 12 is formed of, for example, a resin material and molded with the control circuit 11.

Each first terminal 13 has one end, which is electrically connected to the control circuit 11, and the other end, which projects from the lateral side of the package portion 12. Two adjacent first terminals 13 are at a distance (first distance) L1 from each other. It is noted that, any of two adjacent first terminals 13 may be at the distance (first distance) L1 from each other.

The wiring portion 20 includes a molded portion 21, a second terminal 22, a first fitting portion 23, and the like. Referring to FIG. 1, the wiring portion 20 is equipped with the control circuit portion 10.

The molded portion 21 is in a plate shape and is formed of, for example, a resin material. The molded portion 21 is molded of resin such that the second terminal 22 is embedded in the molded portion 21. The molded portion 21 is formed to include a hydraulic pressure connector portion 27 and an external connector portion 28. The hydraulic pressure connector portion 27 is connected with a hydraulic pressure sensor and a linear solenoid valve. The hydraulic pressure sensor is configured to detect a hydraulic pressure of, for example, an automatic transmission device. The linear solenoid valve functions as an electromagnetic hydraulic pressure control unit to control a hydraulic pressure of, for example, the automatic transmission device. The external connector portion 28 is configured to receive various operation information signals such as a vehicle speed and an engine revolution. The external connector portion 28 is further configured to receive an electric power supplied from an electric power source.

Each of the multiple second terminals 22 is partially embedded in the molded portion 21 and is partially exposed to the outside of the molded portion 21. Each of the second terminals 22 has one end, which is electrically connected with a terminal of the hydraulic pressure connector 27 or a terminal of the external connector 28. Each of the second terminals 22 has the other end, which is electrically connected with the first terminal 13. The other ends of two adjacent second terminals 22 are at a distance (second distance) L2 from each other. It is noted that, any of the other ends of two adjacent second terminals 22 may be at the distance (second distance) L2 from each other.

The first fitting portion 23 is integrally formed with the molded portion 21 such that the first fitting portion 23 surrounds the control circuit portion 10. The first fitting portion 23 includes a square frame-shaped wall portion having three layers. The first fitting portion 23 includes an inner wall 233, an intermediate recessed-and-projected wall 232, and an outer wall 231. Referring to FIG. 1, the first fitting portion 23 circumferentially extends in a first direction. A second direction is along the plane of the molded portion 21 and is substantially perpendicular to the first direction. A third direction is substantially perpendicular to the plane of the molded portion 21.

Each of the inner wall 233 and the outer wall 231 is in a square frame shape and is raised from the control circuit portion 10 of the molded portion 21. The intermediate recessed-and-projected wall 232 is formed between the inner wall 233 and the outer wall 231. The intermediate recessed-and-projected wall 232 has multiple projected portions 234 and multiple recessed portions 235. The intermediate recessed-and-projected wall 232 may be equivalent to a recessed-and-projected portion (staggered portion, indented portion, odd-shaped portion, or corrugated portion). The projected portions 234 and the recessed portions 235 are alternately arranged in the first direction. The height of the projected portions 234 in the third direction is less than the height of both the inner wall 233 and the outer wall 231 in the third direction. The inner wall 233 is equipped with four projected rods 236 at four predetermined locations in the circumferential directions. Each of the projected rods 236 extends in the third direction.

The cover portion 30 is in a square plate shape and is formed of, for example, a resin material. The cover portion 30 has a second fitting portion 31 at the periphery in the circumferential direction. The second fitting portion 31 has multiple projected portions 32 and multiple recessed portions 33. The projected portions 32 are raised in the third direction. Each of the recessed portions 33 is formed between adjacent projected portions 32. The projected portions 32 and the recessed portions 33 may form a projected-and-recessed portion (staggered portion, indented portion, odd-shaped portion, or corrugated portion). The cover portion 30 has mounting holes 34 at positions corresponding to the projected rods 236 of the wiring portion 20, respectively.

The projected rods 236 are inserted into the mounting holes 34, respectively. Subsequently, ends 237 of the projected rods 236 are heated and melted. Thereafter, the ends 237 of the projected rods 236 are cooled thereby to be swaged. Thus, the cover portion 30 is joined to the wiring portion 20. The projected portions 32 are inserted in the recessed portions 235 of the wiring portion 20, respectively. In addition, the projected portions 234 of the wiring portion 20 are inserted in the recessed portions 33 of the cover portion 30, respectively. Thus, the second fitting portion 31 of the cover portion 30 and the first fitting portion 23 of the wiring portion 20 are fitted to each other. In the present embodiment, pedestals 238 are formed around base ends of the projected rods 236, respectively. Each of the pedestals 238 are at a predetermined height. The pedestals 238 form a gap at a predetermined height between the inner wall 233 of the first fitting portion 23 and the cover portion 30.

The first fitting portion 23 and the second fitting portion 31 are fitted to each other. Consequently, a gap M is formed between the first fitting portion 23 and the second fitting portion 31. As follows, the configuration of the gap M will be described in detail with reference to FIG. 3 to FIG. 5.

Figure 3:
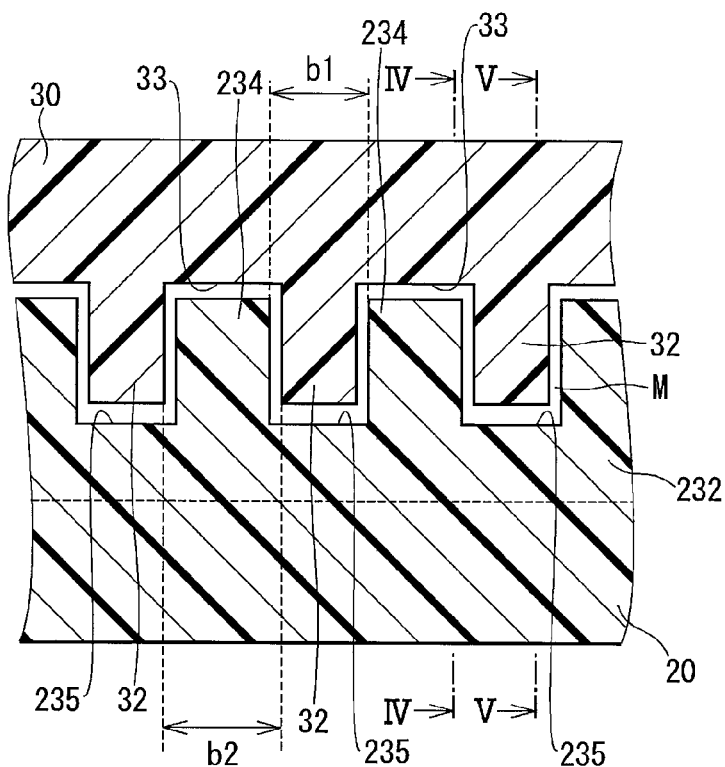
FIG. 3 is a sectional view taken along a line III-III in FIG. 1.
Figure 3:
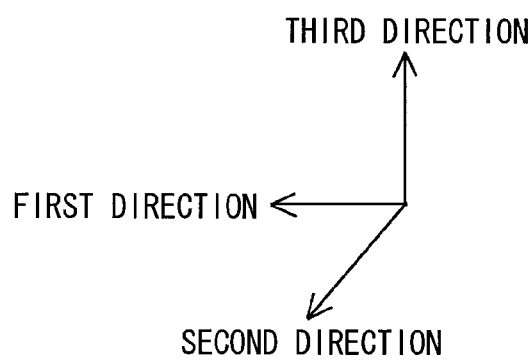

As shown in FIG. 3, the gap M is in a crank form and extends in the first direction. Each of the recessed portions 235 has a width b1 in the first direction. Each of the recessed portions 33 has a width b2 in the first direction. The first fitting portion 23 and the second fitting portion 31 are formed such that the values of b1 and b2 are smaller than the minimum values of L1 and L2, respectively.

Figure 4:
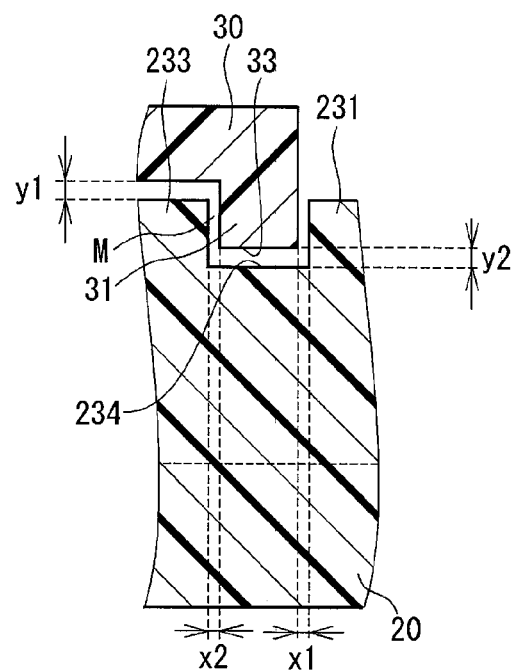
FIG. 4 is a sectional view taken along a line IV-IV in FIG. 3.
Figure 4:
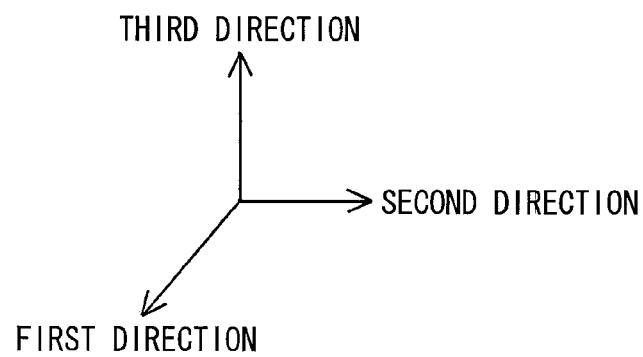
Figure 5:
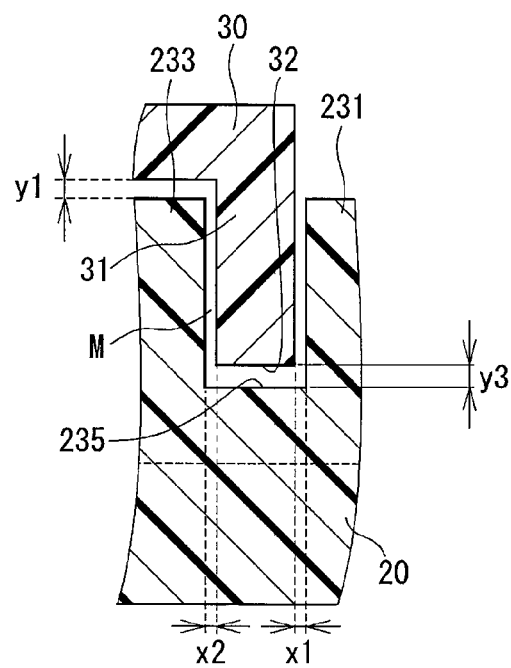
FIG. 5 is a sectional view taken along the line V-V in FIG. 3.
Figure 5:
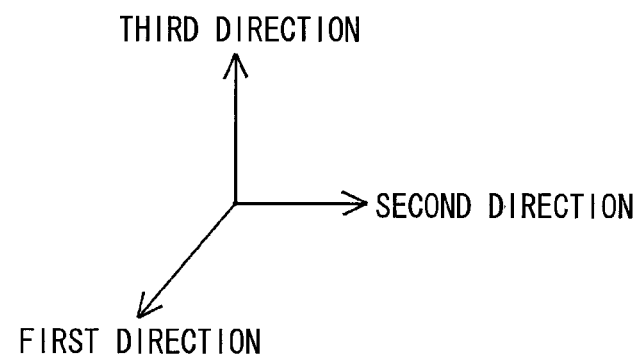

As shown in FIG. 4 and FIG. 5, the gap M is in a crank form and extends in the second direction. The outer wall 231 of the second fitting portion 31 and the first fitting portion 23 are at a distance x1 from each other in the second direction. The inner wall 233 of the second fitting portion 31 and the first fitting portion 23 are at a distance x2 from each other in the second direction. The inner wall 233 of the cover portion 30 and the first fitting portion 23 are at a distance y1 from each other in the third direction. The projected portion 234 of the first fitting portion 23 and the recessed portion 33 of the second fitting portion 31 are at a distance y2 from each other in the third direction. The recessed portion 235 of the first fitting portion 23 and the projected portion 32 of the second fitting portion 31 are at a distance y3 from each other in the third direction. The values of x1 and x2 are equivalent to the width of the gap M in the second direction. The values of y1, y2, and y3 are equivalent to the width of the gap M in the third direction.

The values of x1 and x2 may be equivalent to the minimum value of the width of the gap in the second direction. The values of y1, y2, and y3 may be equivalent to the minimum value of the width of the gap in the third direction. More specifically, the first fitting portion 23 and the second fitting portion 31 may be configured to have the values of x1, x2, y1, and y2 satisfying at least one of the formula (2), the formula (3), and the formula (4), as follows.

$$y1 < -x2\sqrt{(1/(x2/L)^{2/3}-1)} + L\sqrt{(1-(x2/L)^{2/3})} \quad (2)$$

$$y2 < -x2\sqrt{(1/(x2/L)^{2/3}-1)} + L\sqrt{(1-(x2/L)^{2/3})} \quad (3)$$

$$y2 < -x1\sqrt{(1/(x1/L)^{2/3}-1)} + L\sqrt{(1-(x1/L)^{2/3})} \quad (4)$$

In addition, the first fitting portion 23 and the second fitting portion 31 may be configured to have the values of x1, x2, y1, and y3 satisfying at least one of the formula (2), the formula (5), and the formula (6), as follows.

$$y3 < -x2\sqrt{(1/(x2/L)^{2/3}-1)} + L\sqrt{(1-(x2/L)^{2/3})} \quad (5)$$

$$y3 < -x1\sqrt{(1/(x1/L)^{2/3}-1)} + L\sqrt{(1-(x1/L)^{2/3})} \quad (6)$$

Herein, the value of L is a minimum value of L1 and L2.

Figure 6A:
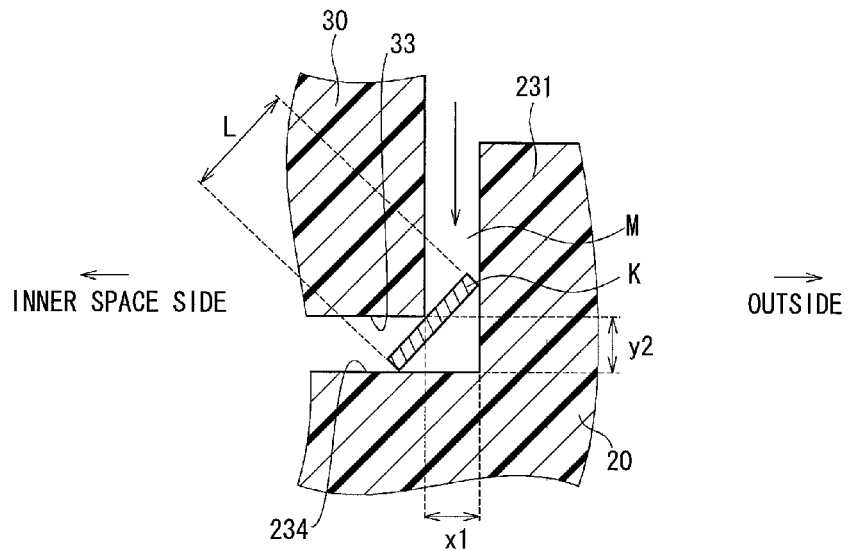
FIG. 6A and FIG. 6B are schematic views each showing an exemplified state of the electronic control unit according to the one embodiment.
Figure 6B:
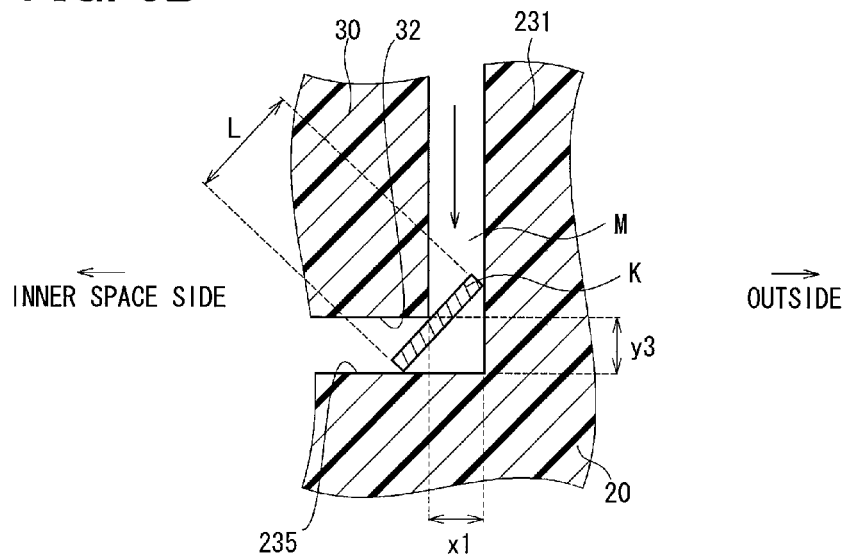

In the present embodiment, the first fitting portion 23 and the second fitting portion 31 are formed such that the values of x1 and y2 satisfy the formula (4), and the values x1 and y3 satisfy the formula (6). In the exemplified state of FIG. 6A and FIG. 6B, a metallic foreign particle K, which is in a length L, is caught in the gap M. More specifically, in FIG. 6A, the metallic foreign particle K is caught between the projected portion 234 of the first fitting portion 23 and the recessed portion 33 of the second fitting portion 31. In FIG. 6B, the metallic foreign particle K is caught between the recessed portion 235 of the first fitting portion 23 and the projected portion 32 of the second fitting portion 31. As shown in FIG. 6A and FIG. 6B, the metallic foreign particle K is moved in the direction shown by the arrow and is caught between the first fitting portion 23 and the second fitting portion 31. Consequently, the metallic foreign particle K cannot move into the inner space.

As described above, the gap M is formed between the first fitting portion 23 and the second fitting portion 31, according to the configuration of the present embodiment. The present configuration restricts pressure in the inner space between the wiring portion 20 and the cover portion 30 from increasing due to increase in temperature. Therefore, deformation of the cover portion 30 can be avoided. In addition, breakage of the joint portion between the first terminal 13 and the second terminal 22 can be avoided.

Furthermore, according to the present embodiment, both the first fitting portion 23 and the second fitting portion 31 are formed such that the gap M in a crank form extends in the first direction or the second direction. The present configuration restricts a long and thin needlelike foreign particle from intruding into the inner space through the gap M in the direction in parallel with the first direction or the second direction. Therefore, it is possible to avoid shortcircuit between two adjacent first terminals 13 or between two adjacent second terminals 22 due to an electrically conductive foreign particle.

In the present embodiment, both the values of b1 and b2 are smaller than the value of L in the first direction. The present configuration restricts a foreign particle, which is in a length larger than the value L, from intruding into the inner space in the direction in parallel to the first direction.

Furthermore, in the present embodiment, the first fitting portion 23 and the second fitting portion 31 are formed such that the values of x1 and y2 satisfy the formula (4), and the values x1 and y3 satisfy the formula (6). As described above with reference to FIG. 6A and FIG. 6B, the present configuration restricts a foreign particle, which is in a length larger than the value L, from intruding into the inner space in the direction perpendicular to the first direction. Thus, it is possible to restrict a foreign particle, which is in a length larger than the value of L, from moving into the inner space. Therefore, it is possible to restrict adjacent two of the first terminals 13 or adjacent two of the second terminals 22 from causing short circuit therebetween.

In the present embodiment, the electronic control unit 1 is mounted such that the cover portion 30 is located on the lower side relative to the wiring portion 20 in the vertical direction. The vertical direction may be a direction of gravitational force. With the present configuration, even if a foreign particle intrudes into the inner space, the foreign particle falls to the cover portion 30. Therefore, it is possible to avoid a foreign particle, which has intruded into the inner space, from accumulating around the first terminals 13 or the second terminals 22.

In the present embodiment, the wiring portion 20 and the cover portion 30 are joined to each other by swaging the ends 237 of the projected rods 236, which are located at the predetermined locations along the circumferential direction. The present configuration restricts the cover portion 30 and the wiring portion 20 from being tightly in contact with each other, thereby to restrict pressure in the inner space between the wiring portion 20 and the cover portion 30 from increasing due to increase in temperature. In addition, it is possible to reduce manufacturing period and cost for a mounting process of the cover portion 30 onto the wiring portion 20. In addition, the width of the gap M between the first fitting portion 23 and the second fitting portion 31 in the third direction can be adjusted by regulating the height of the pedestals 238, which are equipped to the projected rods 236, respectively.

Other Embodiment

In the above embodiment, each of the first fitting portion and the second fitting portion is in a square frame shape. Alternatively, the first fitting portion and/or the second fitting portion may be in a circular frame shape or may be in another polygonal frame shape.

In the above embodiment, the first fitting portion and the second fitting portion are formed such that the values of x1 and y2 satisfy the formula (4), and the values x1 and y3 satisfy the formula (6). Alternatively, the first fitting portion and the second fitting portion may be formed such that the values of x1, x2, y1, and y2 satisfy at least one of the formula (2), the formula (3), and the formula (4), and the values x1, x2, y1, and y3 satisfy at least one of the formula (2), the formula (5), and the formula (6).

In the above embodiment, the first direction substantially coincides with the circumferential direction of the first fitting portion. Alternatively, the first direction may not coincide with the circumferential direction.

The above-described electronic control unit may be equipped in the automatic transmission device and may be configured to control the automatic transmission device. The electronic control unit may include the control circuit portion, the wiring portion, and the cover portion. The control circuit portion may include the control circuit, the package portion, which is molded with the control circuit, and the first terminals, which are electrically connected with the control circuit and are exposed to the outside of the package portion. The wiring portion may include the second terminals, which are electrically connected with the first terminals, the molded portion molded with a part of the second terminal, and the first fitting portion, which is equipped to the molded portion and is located on the side of the control circuit portion. The first fitting portion may be in the frame shape to surround the control circuit portion. The cover portion may be equipped to the wiring portion. The cover portion may include the second fitting portion configured to be fitted to the first fitting portion. the cover portion may be configured to surround the control circuit portion by fitting the second fitting portion to the first fitting portion. The first fitting portion and the second fitting portion may be configured to form the gap therebetween. The gap may extend in a crank form along the first direction, and the gap may extend in a crank form along the second direction, which is perpendicular to the first direction. The wording of "perpendicular" or "perpendicularly" is not limited to a configuration, in which, for example, the first direction is exactly at a right angle relative to the second direction, and may represent a configuration, in which the first direction is at a predetermined angle relative to the second direction.

The first fitting portion and the second fitting portion may define the gap therebetween, thereby to restrict pressure in the inner space between the cover portion and the wiring portion from increasing, due to increase in temperature. In this case, deformation of the cover portion can be avoided. In addition, breakage of the joint portion between the first terminal and the second terminal can be avoided. The first fitting portion and the second fitting portion may form the gap therebetween. In this case, the gap may extend in a crank form along the first direction, and the gap may extend in a crank form along the second direction, which is perpendicular to the first direction. The present configuration restricts a long and thin needlelike foreign particle from intruding into the inner space in a direction in parallel with the first direction or the second direction. Therefore, it is possible to avoid shortcircuit between two adjacent first terminals or between two adjacent second terminals due to an electrically conductive foreign particle. The wording of "perpendicular" or "perpendicularly" is not limited to a configuration exactly at a right angle therebetween, and may represent a configuration at a predetermined angle therebetween. Furthermore, in the present configuration, the first fitting portion and the second fitting portion form the gap therebetween to enable reduction in molding accuracy of the first fitting portion and the second fitting portion thereby to reduce its manufacturing cost.

The first direction may coincide with the circumferential direction of the first fitting portion. In the present configuration, the gap extends in a crank form along the circumferential direction of the first fitting portion. Therefore, the configuration enables to avoid intrusion of a foreign particle into the inner space in a direction, which is in parallel with the circumferential direction of the first fitting portion.

The first fitting portion may include the recessed-and-projected portion extending in a staggered form along the first direction. In this case, the second fitting portion may include the projected-and-recessed portion extending in an staggered form along the first direction correspondingly to the recessed-and-projected portion. In this case, the width of the recessed portion of both the recessed-and-projected portion and the projected-and-recessed portion in the first direction may be smaller than both the distance (first distance) between two of the first terminals, which are adjacent to each other, and the distance (second distance) between two of the second terminals, which are adjacent to each other.

In the present configuration, the width of the recessed portion of the recessed-and-projected portion and the projected-and-recessed portion in the first direction is smaller than the distance between two first terminals, which are adjacent to each other, and the distance between two second terminals, which are adjacent to each other. Therefore, even when a foreign particle, which is longer than the distance between two adjacent first terminals and the distance between two adjacent second terminals, exists, it is possible to avoid intrusion of such a foreign particle into the inner space in a direction in parallel with the first direction. Therefore, it is possible to avoid shortcircuit between two adjacent first terminals or between two adjacent second terminals due to an electrically conductive foreign particle.

In a portion of the gap formed perpendicularly to the second direction, the width of the gap in the second direction may have a minimum value X, and the width of the gap in the third direction may have a minimum value Y. The third direction may be perpendicular to both the first direction and the second direction. In this case, the distance between two first terminals, which are adjacent to each other, and the distance between two second terminals, which are adjacent to each other, may have a minimum value L. In this case, the first fitting portion and the second fitting portion may be formed to satisfy a following formula (1). "The distance between two second terminals, which are adjacent to each other" may represent the distance between ends of the two second terminals, which are adjacent to each other, at which the two second terminals are connected to the corresponding first terminals.

$$Y < -X\sqrt{(1/(X/L)^{2/3}-1)} + L\sqrt{(1-(X/L)^{2/3})} \qquad (1)$$

In the present configuration, even when a foreign particle, which is longer than the distance between the two adjacent first terminals and the distance between the two adjacent second terminals, exists, it is possible to avoid intrusion of such a foreign particle into the inner space in a direction perpendicular to the first direction. Therefore, it is possible to avoid shortcircuit between two adjacent first terminals or between two adjacent second terminals due to an electrically conductive foreign particle.

The electronic control unit may be equipped to the automatic transmission device such that the cover portion is located on the lower side in the vertical direction relative to the wiring portion.

In the present configuration, the cover portion is located on the lower side of the wiring portion in the vertical direction. Therefore, when a foreign particle intrudes into the inner space, the foreign particle may fall onto the cover portion. Therefore, it is possible to avoid a foreign particle, which has intruded into the inner space, from accumulating around the first terminals or the second terminals.

The wiring portion and the cover portion may be joined with each other at predetermined locations of the first fitting portion in the circumferential direction.

The present configuration restricts the cover portion and the wiring portion from being tightly in contact with each other, thereby to restrict pressure in the inner space between the wiring portion and the cover portion from increasing due to increase in temperature. In addition, it is possible to reduce manufacturing period and cost for a mounting process of the cover portion onto the wiring portion. Furthermore, the width of the gap between the first fitting portion and the second fitting portion can be easily adjusted.

The above control processings are not limited being executed by the electronic control unit 1. The control unit may have various structures including the electronic control unit 1 shown as an example.

The above control processings may be performed by any one or any combinations of software, an electric circuit, and the like. The electric circuit may be an integrated circuit, and may be a discrete circuit, such as a hardware logic configured with electronic elements, accommodated in the inner space.

The elements producing the above control processings may be discrete elements and may be partially or entirely integrated.

It should be appreciated that while the processes of the embodiments of the present disclosure have been described herein as including a specific sequence of steps, further alternative embodiments including various other sequences of these steps and/or additional steps not disclosed herein are intended to be within the steps of the present disclosure.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. An electronic control unit comprising:
a control circuit portion including a control circuit, a package portion molded with the control circuit, and a plurality of first terminals electrically connected with the control circuit and exposed to an outside of the package portion; a wiring unit including a plurality of second terminals electrically connected with the plurality of first terminals, and a molded portion molded with a part of the plurality of second terminals, the molded portion including a first fitting portion located on a side of the control circuit portion, the first fitting portion being in a frame shape and surrounding the control circuit portion; a cover portion including a second fitting portion fitted to the first fitting portion of the wiring unit to cover the control circuit portion, wherein the first fitting portion and the second fitting portion form a gap therebetween, the gap extending in a crank form along a first direction and extending in a crank form along a second direction, which is perpendicular to the first direction, wherein the first fitting portion includes a recessed-and-projected portion extending in a staggered form along the first direction, the second fitting portion includes a projected-and-recessed portion extending in a staggered form along the first direction, the projected-and-recessed portion corresponding to the recessed-and-projected portion, and each of the recessed-and-projected portion and the projected-and-recessed portion include a recessed portion having a width in the first direction, the width is smaller than both a first distance between two of the plurality of first terminals, which are adjacent to each other, and a second distance between two of the plurality of second terminals, which are adjacent to each other.

2. The electronic control unit according to claim 1, wherein the first direction coincides with a circumferential direction of the first fitting portion.

3. The electronic control unit according to claim 2, wherein in a portion of the gap formed perpendicularly to the second direction,
a width of the gap in the second direction has a minimum value X,
a width of the gap in a third direction has a minimum value Y, the third direction being perpendicular to both the first direction and the second direction,
a distance between two of the plurality of first terminals, which are adjacent to each other, and a distance between two of the plurality of second terminals, which are adjacent to each other, have a minimum value L, and
the first fitting portion and the second fitting portion are formed to satisfy a formula (1), $$Y < -X\sqrt{(1/(X/L)^{2/3}-1)} + L\sqrt{(1-(X/L)^{2/3})} \qquad (1)$$

4. The electronic control unit according to claim 1, wherein the electronic control unit is equipped to an automatic transmission device such that the cover portion is located on a lower side relative to the wiring unit in a vertical direction.

5. The electronic control unit according to claim 1, wherein the wiring unit and the cover portion are joined with each other at predetermined locations of the first fitting portion, the predetermined locations being along the circumferential direction.

6. The electronic control unit according to claim 1, wherein the electronic control unit is equipped in an automatic transmission device and configured to control the automatic transmission device.

* * * * *